US006326121B1

(12) United States Patent
Takahashi

(10) Patent No.: US 6,326,121 B1
(45) Date of Patent: Dec. 4, 2001

(54) THERMAL TRANSFER MATERIAL AND LASER THERMAL TRANSFER RECORDING METHOD

(75) Inventor: Yohnosuke Takahashi, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/592,811

(22) Filed: Jun. 13, 2000

(30) Foreign Application Priority Data

Jun. 14, 1999 (JP) ..................... 11-167406

(51) Int. Cl.[7] ..................... G03F 7/34; G03F 7/09; G03B 27/60; B41J 2/435

(52) U.S. Cl. ..................... 430/200; 430/207; 430/271.1; 355/73; 347/192; 347/262

(58) Field of Search ..................... 430/200, 201, 430/207, 271.1; 355/73; 347/197, 262

(56) References Cited

U.S. PATENT DOCUMENTS 5,580,693 * 12/1996 Nakajima et al. ..................... 430/200
5,856,060 * 1/1999 Kawamura et al. ..................... 430/200
5,939,231 * 8/1999 Kawamura et al. ..................... 430/200
6,027,850 * 2/2000 Kawakami et al. ..................... 430/200

FOREIGN PATENT DOCUMENTS 6-79980 3/1994 (JP) ..................... B41M/5/40

OTHER PUBLICATIONS

Patent Abstract of Japan 06079980 Mar. 22, 1994.

* cited by examiner

*Primary Examiner*—Richard L. Schilling
(74) *Attorney, Agent, or Firm*—Sughrue, Mion, Zinn, Macpeak & Seas, PLLC

(57) ABSTRACT

A thermal transfer material is provided which has a support on which a light-to-heat conversion layer and an image forming layer are provided, wherein a smoothster value of the surface of the image forming layer is no more than 2 mmHg, and a center line average surface roughness Ra thereof is in a range of 0.03 to 0.2 $\mu$m. Also provided is a laser thermal transfer recording method in which the thermal transfer material and a thermal transfer image receiving material are laminated to each other to produce a laminate. Further provided is a laser thermal transfer recording method in which the thermal transfer material and a thermal transfer image receiving material are laminated to each other to produce a laminate, the laminate is irradiated with a multi-mode semiconductor laser, the thermal transfer material and the thermal transfer image receiving material are peeled from each other, and an image is thereby formed on the thermal transfer image receiving material.

19 Claims, No Drawings

THERMAL TRANSFER MATERIAL AND LASER THERMAL TRANSFER RECORDING METHOD

BACKGROUND OF THE INVENTION

1. Field of the Invention

The present invention relates to a thermal transfer material and a laser thermal transfer recording method in which thermal transfer of an image is performed by irradiation of a laser. More particularly, the present invention relates to a thermal transfer material in which a color proof (DDCP: direct digital color proof) or a masking image in printing is formed due to irradiation of a laser on the basis of digital image signals, and to a laser thermal transfer recording method.

2. Description of the Related Art

There is a thermal transfer and recording technique, in which a thermal transfer image receiving material, and a thermal transfer material having a support on which a color material layer is provided, are laminated to each other. The color material layer contains therein a thermally soluble color material layer or a thermally sublimating dye. The laminated thermal transfer image receiving material and thermal transfer material are heated imagewise from the thermal transfer material side by using a heating device which is controlled by electric signals, such as a thermal head, or an electrically conductive head to thereby transfer and record an image onto the thermal transfer image receiving material.

Such a thermal transferring and recording technique has characteristics of low noise, being maintenance free, having low manufacturing cost, facilitating coloring, and being capable of digital recording. This technique is therefore utilized in multiple fields such as in various types of printers, recorders, facsimiles, and computer terminals.

On the other hand, in recent years, in the medical and printing fields, demands have been made for recording systems which have a higher resolution and enable high speed recording as well as enabling image processing, i.e., recording systems which enable so called digital recording. However, in the thermal transfer and recording system in which a heating device such as a thermal head or an electrically conductive head is used, image resolution of this system is constrained by the layout density of the heating elements of a head. Further, it is difficult to control the heating temperature of the heating elements at a high speed, due to the characteristics of the heating elements. Accordingly, it is difficult to obtain a high resolution image at higher speed.

One system capable of providing an image with higher resolution at higher speed is a laser recording technology which utilizes a light-to-heat conversion action due to the irradiation of a laser. Recently this system has attracted much attention and is being manufactured as a finished product.

In an image forming system using this technology, in particular, the single mode laser is generally used from the standpoint of attaining highly accurate and finely focused beams, and due to such beam quality, a high resolution image is obtained. On the other hand, although recording speed is also improved such that an image is formed more speedily than in a conventional recording system which uses a heating device such as a thermal head, since the power of the single mode laser is in the relatively low range of about 150 to 200 mW, the single mode laser has not reached a satisfactory level with regards to its productivity.

The recording sensitivity of the recording material itself and laser power level are large factors in determining the recording speed during laser recording. In particular, increased laser power facilitates high speed recording of a high resolution image. In order to increase the laser power, usually, a multi-mode semiconductor laser having higher power than the single mode laser is used. Accordingly, this multi-mode semiconductor laser has a high power of 1W or more thus enabling a considerable increase in laser power of the laser head.

By using the multi-mode semiconductor laser, recording power is increased, and it becomes possible to improve the recording speed. However, there is a problem in that the multi-mode semiconductor laser has difficulties in converging a laser beam in the widthwise direction and so the laser beam cannot be converged to have a focal beam diameter as low as 20 $\mu$m or less.

In the medical or printing fields, when attempts are made to record a highly accurate image having a sub-scanning pitch of about 10 $\mu$m using the multi-mode semiconductor laser, adjacent beams are made to overlap with each other and overlapping portions are heated excessively, thus causing a problem in that uniform image recording is not carried out and image quality thereby deteriorates.

Typically, in a thermal transfer type (image) recording method using light-to-heat conversion action due to irradiation of a laser, a laminate, in which a thermal transfer material having an image forming layer and a thermal transfer image receiving material having an image receiving layer are laminated to each other, is irradiated with a laser. In a case where the image forming layer and the image receiving layer are in a state of being completely in contact with each other, the image forming layer and the image receiving layer each of whose temperature and ability to be set in close contact with each other have increased due to the irradiation of the laser are set in tight contact with each other. Heat is transmitted from the image forming layer to the image receiving layer, and at the same time, the surface of the image receiving layer is plasticized. Accordingly, the image receiving layer and the image forming layer can be brought in close contact with each other. By peeling the image forming layer and the image receiving layer off from each other, it is possible to transfer an image which has high sensitivity and is also uniform.

As described above, it is possible to obtain a state in which the image forming layer and the image receiving layer are set in complete contact with each other by a method in which the image forming layer and the image receiving layer are laminated to each other by passing these layers through heating rollers or pressure rollers. However, on the other hand, such a method as described above is disadvantageous in that these layers are liable to be affected by a change of temperature of the roller, or the like, processes involved become complicated, and the manufacturing cost is high. In order to solve these problems, in recent years, there has been known a method in which the image forming layer and the image receiving layer are set in contact with each other with pressure applied therebetween reduced by vacuum-suctioning (which is referred to an evacuation method hereinafter). In such a method in a case in which the smoothness of each of the surfaces of the image forming layer and the image receiving layer is too high, when the pressure applied between the image forming layer and the image receiving layer is reduced, only the peripheral portions of the surfaces whose smoothness is excessively high are set in contact with each other. Accordingly, air pockets may form at central portions of the image forming layer and the image receiving layer which are in contact with each other, thus causing poor image transfer. For this reason, in order to secure a passage for air flow when pressure is reduced and thus obtained uniform contact (adherence) between the image forming layer and the image receiving layer, the surface of the image forming layer or the image receiving layer is roughened by using a matte agent, or the like.

The vacuum-suction pressure reduction method in which the pressure applied between the image forming layer and the image receiving layer is reduced by vacuum-suctioning is preferable because, even when the image forming layer and the image receiving layer are large, these layers can be set in contact with each other uniformly. However, when the surfaces of the layers are rough, microscopic air gaps (i.e., air gaps formed at recessed portions of the roughened surface) may form at portions between the image forming layer and the image receiving layer which are set in contact with each other after this method. If these air gaps have a small size and the number of gaps is small, it is unlikely that they will cause excessive damage to an image since close contact between the image forming layer and the image receiving layer can be maintained by thermal deformation of the thermal transfer (image forming) layer during the irradiation of the laser. However, when the surfaces of the image forming layer and the image receiving layers are even rougher in order to increase the pressure reduction speed, larger microscopic air gaps form between the image forming layer and the image receiving layer. These air gaps become larger in accordance with the increase of the pressure reduction speed, thus greatly affecting the image.

If as described above, air gaps form between the image forming layer and the image receiving layer which are set in contact with each other, thermal transmission from the image forming layer to the image receiving layer is impeded. As a result, the temperature of the image receiving layer cannot increase to a temperature which suffices for plasticization of the image receiving layer. Contact between the image forming layer and the image receiving layer decreases at portions at which large microscopic air gaps are formed. Accordingly, thermal energy which was not transmitted to the image receiving layer remains at portions of the thermal transfer layer or the light-to-heat conversion layer, and the portions are heated excessively to thereby generate a gas. The air gaps expand more at the interface between the image forming layer and the image receiving layer which are in contact with each other. Due to the expansion, contact between the image forming layer and the image receiving layer further deteriorates thus causing poorer image transfer. Moreover, products of the thermal decomposition of the components of the light-to-heat conversion layer (such as binder or color material) are transferred to the image receiving layer, thus causing image defects such as a fogging.

There is a tendency for this phenomenon to be more noticeable the larger the size of materials (A2 or larger), and accordingly, image quality deteriorates greatly. Namely, it is though that in a case of large materials, in order to make these materials contact to each other uniformly, the surface roughness of the contact surface of each of the materials must be increased.

In order to achieve an increased recording speed by using a high powered laser described above in which the adjacent beams overlap, a thermal transfer material in which the layers are capable of being set in complete and uniform contact is required. This is achieved if large microscopic gaps are not formed between the thermal transfer layer, which is irradiated with lasers, and the thermal image receiving material.

As described above, the current situation is such that there has not yet been provided a thermal material which can be subjected to vacuum suctioning at high speed and simultaneously set in close contact with a thermal transfer image receiving material, and which enables formation of high quality image without impeding recording by heat even when a high output laser is used.

SUMMARY OF THE INVENTION

In order to solve the aforementioned problems, it is an object of the present invention to provide a thermal transfer material in which, even in a case of large-size material, high speed vacuum-suctioning can be performed during laser thermal transfer recording, and which can be set in close contact with a thermal transfer image receiving material, and a laser thermal transfer recording method.

As the result of repeatedly conducting experiments relating to heat properties of thermal transfer material, the present inventors arrived upon effective countermeasures described below. Namely, when high speed vacuum suctioning is performed in an effort to set the thermal transfer material and the thermal transfer image receiving layer in closer contact with each other, if the surface properties of the thermal transfer material and the thermal transfer receiving material are such that the center line average roughness Ra and the smoothster value do not fall within a specified range, there is a tendency that both close and uniform contact of the layers with each other, and high speed vacuum suctioning cannot be achieved at the same time.

The present invention is based on the aforementioned countermeasures, and the problems solved by the present invention are described below.

A first aspect of the present invention is a thermal transfer material comprising a support, and a light-to-heat conversion layer and an image forming layer provided on the support, the image forming layer having a surface with a smoothster value of no more than 2 mmHg, and a center line average surface roughness Ra of the surface of the image forming layer is in a range of 0.03 to 0.2 $\mu$m.

A second aspect of the present invention is a method of forming a laser thermal transfer recording material comprising the steps of: (a) forming a thermal transfer material by providing on a support a light-to-heat conversion layer and an image forming layer, with the image forming layer having a smoothster value of no more than 2 mmHg, and a center line average surface roughness Ra in a range from 0.03 to 0.2 $\mu$m; and (b) adhering a thermal transfer image receiving material and the thermal transfer material to each other by an evacuation method. A third aspect of the present invention is a laser thermal transfer recording method, comprising the steps of: (a) forming a thermal transfer material by providing on a support a light-to-heat conversion layer and an image forming layer, with the image forming layer having a smoothster value of no more than 2 mmHg, and a center line average surface roughness Ra in a range from 0.03 to 0.2 $\mu$m; (b) adhering a thermal transfer image receiving material and the thermal transfer material to each other by an evacuation method; (c) directing laser light onto said thermal transfer material to form an image; and (d) separating the thermal transfer image receiving material and the thermal transfer material from each other.

DESCRIPTION OF THE PREFERRED EMBODIMENT

A thermal transfer material of the present invention has a light-to-heat conversion layer and an image forming layer which are provided on a support, and can have other layers if necessary.

In a laser thermal transfer recording method of the present invention, which uses the thermal transfer material of the present invention, the image forming layer of the thermal transfer material and an image receiving layer of the thermal transfer image receiving material which will be described later are brought into close and uniform contact with each other. In this state, the thermal transfer material and the thermal transfer image receiving material thus laminated to each other are irradiated imagewise with laser light from the thermal transfer material side. Namely, laser light is directed onto the laminate to form an image. Thereafter, these materials are peeled off from each other so that an image is formed on the thermal transfer image receiving material.

The thermal transfer material of the present invention will be explained hereinafter. In accordance with this explanation, the laser thermal transfer recording method of the present invention which uses the thermal transfer material will be described in more detail hereinafter.

<Thermal Transfer Material>

A thermal transfer material is formed by at least a light-to-heat conversion layer and an image forming layer being laminated to each other and provided on a support in this order. The thermal transfer material may have other layers such as a heat-sensitive peeling layer or a cushion layer if necessary.

Image Forming Layer

First, a description of an image forming layer will be given.

The image forming layer is a layer which includes therein at least a pigment and an amorphous organic high polymer. The surface of the image forming layer has surface physical properties such that a smoothster value is 2 mmHg or less, and a center line average surface roughness Ra is in a range of 0.03 to 0.2 μm. By setting the surface physical properties of the surface of the image forming layer such that the smoothster value and the central line average surface roughness Ra, respectively, are in the aforementioned ranges, it is possible to perform vacuum-suctioning rapidly when the image forming layer and the thermal transfer image receiving material are set in close contact with each other due to reduced pressure during laser thermal transfer recording. At the same time, the image forming layer of the present invention can obtain uniform adhesiveness since inadequate air gaps or the like are not formed between the image forming layer and the thermal transfer image receiving material which are being set in close contact with each other after vacuum-suctioning.

In carrying out an image recording, a laminate is used which is formed by laminating the image receiving layer of the thermal transfer image receiving material and the image forming layer of the thermal transfer material to each other such that they are in contact with each other. The laminate is exposed imagewise to the laser so as to transfer an image of the image forming layer of the thermal transfer material onto the image receiving layer of the thermal transfer image receiving material. Due to directing a laser and separating the lamination, exposed portions of the image forming layer, which are exposed imagewise, move from the thermal transfer material to the thermal transfer image receiving material. If the thermal transfer image receiving material and the thermal transfer material are not set in sufficiently close and uniform contact with each other, transmission of the converted heat energy of the irradiated laser to the image receiving layer is impeded, plasticization of the image receiving layer becomes insufficient, and thereby causes poor transfer. In particular, at portions at which the thermal transfer image receiving material and the thermal transfer material are not set in sufficiently close and uniform contact, when a high power laser such as a multi-mode semiconductor laser is used for irradiation of the laminate, the impeded thermal transmission described above causes excessive temperature increase on the light-to-heat conversion layer and/or the image forming layer of the thermal transfer material. As a result, the light-to-heat conversion layer, or the like decomposes thermally and gas is generated therefrom. Accordingly, larger air gaps are formed at the portions at which the thermal transfer image receiving material and the thermal transfer material are not in sufficiently close contact, thus deteriorating thermal transmissivity and transferability from the image forming layer to the image receiving layer.

There are a number of examples of methods for forming the laminate described above. For example, a vacuum contact method can be used to set the layers in contact with each other from the viewpoint that temperature control by using a heat roller or the like is unnecessary, and rapid and uniform lamination is enabled. In this case, in decreasing the surface roughness of the image forming layer in order for the thermal transfer image receiving material and the thermal transfer material to fit more closely with each other as described above, though a close fit is achieved, it becomes impossible to carry out high speed pressure reduction during vacuum-suctioning. On the contrary, in increasing the surface roughness of the image forming layer in order to carry out this vacuum-suctioning more speedily, the degree of pressure reduction at the surface between the image receiving layer and the image forming layer which are in contact improves. Namely, the vacuum-suctioning can be carried out speedily. However, many microscopic air gaps form on this contact surface which prevent the image forming layer and the image receiving layer from being in close contact with each other, and a larger number of air gaps are thereby formed at the adhesion surface. As a result, it was not preferable to use this vacuum adhesion method in view of reduced transferability and image quality.

The surface physical properties of the thermal transfer material (image forming layer) must be determined such that high speed vacuum-suctioning can be performed, images can be recorded by using a high power laser such as a multi-mode semiconductor laser, and even if gas is generated from the thermal transfer material, formation of undesired air gaps at the contact surface between the image receiving layer and the image forming layer is prevented. Namely, in order to obtain appropriate contact for image recording, preferably, it is preferable that the surface of the image forming layer has a configuration which varies in accordance with the increase of the degree of pressure reduction at the contact surface. Due to the configuration, the image forming layer and the image receiving layer can be made to contact with each other fully and uniformly.

In the present invention, the following parameters fall in the ranges listed below.

The center line average surface roughness Ra (which, in some cases, is simply referred to as "Ra value") is used as the parameter which expresses the degree of pressure reduction in a state in which no external pressure is imparted to the laminated structure of the image forming layer and the image receiving layer. From the viewpoint of the image receiving layer and the image forming layer being in sufficient contact with each other at the contact surface, the Ra value of the surface of the image forming layer of the thermal transfer material is in a range of 0.03 to 0.2 μm, preferably 0.04 to 0.15 μm, and more preferably 0.05 to 0.1 μm.

When the Ra value is less than 0.03 μm, the surface of the image forming layer is too smooth, and a large amount of unevenness due to pressure reduction is created at the circumferential and central portions and a central portion of the thermal transfer material; at the start of pressure reduction due to vacuum-suction. When the Ra value is more than 0.2 μm, less time is needed to bring the thermal transfer material and the thermal transfer image receiving material in close contact with each other. However, microscopic air gaps which prevent the image receiving layer and the image forming layer from being in close contact with each other are formed at the contact surface. As a result, poor image transfer failure and image quality deterioration may be caused.

The Ra value can be measured on the basis of JIS B0601 by using a surface roughness measuring device (Surfcom manufactured by Tokyo Seiki Co., Ltd.), or the like.

The smoothster value is used as a parameter which represents the surface smoothness of the image forming layer. The smoothster value is measured by using a diffusive semiconductor pressure transducer and is expressed as the change in pressure which is caused by a change in the amount of airflow. The airflow is determined by the smoothness of the surface. The smaller the smoothster value, the higher the surface smoothness. That is, if the concave and convex portions on the surface are small, or else are few, the amount of airflow between the gaps of these concave and convex portions is also small. Specifically, smoothness can be measured as below.

A pipe having a vacuum pump therein and having an objective head having an area of $a^1$ at one end of the pipe, and a throttling having an area of $a^2$ between the objective head and the vacuum pump is prepared. The objective head is made to contact with the surface to be measured (for example, the surface of the image forming layer) and air is suctioned into the pipe by using the vacuum pump. Pressure P inside the pipe between the throttling and the objective head varies in accordance with an area ratio of $a^1$ to $a^2$, and can be expressed by the following equation.

$a^2$ varies in accordance with an object to be measured, and pressure P represents the surface smoothness of each of the objects to be measured.

$P=(a^2/a^1)Pz$ [Pz: atmospheric pressure]

A measuring device for measuring a surface smoothness may be, for example, a smoothness tester (DIGITAL SMOOTHSTER manufactured by Toei Electronics Co., Ltd.).

In the present invention, the smoothster value is 2 mmHg or less, and preferably 1 mmHg or less.

When the smoothster value exceeds 2 mmHg, undesirable gaps are formed. For example, a large number of microscopic air gaps which prevent the image receiving layer and the image forming layer from contacting with each other are formed at the adhesion interface between the image receiving layer and the image forming layer. For this reason, there may be caused transfer failure and deterioration of image quality.

In addition to the above-described vacuum contact method in which the layers are settled in contact with each other, a laminate forming method may preferably be, for example, a method in which the thermal transfer material at an image transfer side (i.e., an image forming layer side) thereof and the thermal transfer image receiving material at an image receiving side (i.e., an image receiving layer side) thereof are made to be laminated with each other, and passed through pressurizing rollers or heating rollers. In this case, for example, heating temperature is preferably 160° C. or less, and more preferably 130° C. Further, the laminate forming method may preferably be, for example, a method in which a thermal transfer material and a thermal transfer image receiving material are kept in close contact with each other such that the thermal transfer image receiving material is mechanically adhered around a metal drum while being stretched, and the thermal transfer material is also mechanically adhered thereon while being stretched in the same manner as the thermal transfer image receiving material. Among these examples, the vacuum contact method is particularly preferable.

Pigments contained in the image forming layer are broadly classified into the two groups of organic pigments and inorganic pigments. The coating film comprising former has particularly excellent transparency while the coating film comprising the latter has generally excellent masking power.

In using the thermal transfer material of the present invention for a printing color proof, organic pigments which correspond to yellow, magenta, cyan, and black generally used for printing ink, and which have closer color tones are suitably used. In addition to these, metal powders, fluorescent pigments, and the like can also be used.

Among the aforementioned pigments, suitable examples thereof include: azo-based pigments, phthalocyanine-based pigments, anthraquinone-based pigments, dioxazine-based pigments, quinacridone-based pigments, isoindolinone-based pigments, nitro-based pigments, or the like.

Typical pigments for each of hues are as follows:

(1) Examples of Yellow pigments include: Hansa Yellow G, Hansa Yellow 5G, Hansa Yellow 10G, Hansa Yellow A, Pigment Yellow L, Permanent Yellow NCG, Permanent Yellow FGL, Permanent Yellow HR, and the like.

(2) Examples of Red pigments include: Permanent Red 4R, Permanent Red F2R, Permanent Red FRL, Lake Red C, Lake Red D, Pigment Scarlet 3B, Bordeaux 5B, Alizarin Lake, Rhodamine Lake B, and the like.

(3) Examples of Blue pigments include: phthalocyanine blue, Victoria Blue Lake, Fast Sky Blue, and the like.

(4) Black pigments include Carbon black, and the like.

Examples of an amorphous organic high polymer which may be contained in the image forming layer and which has a softening point ranging from 40 to 150° C., include: butyral resins; polyamide resins; polyethyleneimine resins; sulfonamide resins; polyesterpolyol resins; petroleum resins; homopolymers or copolymers of vinyltoluene, styrene, α-methylstyrene, 2-methylstyrene, chlorostyrene, vinylbenzoic acid, sodium vinylbenzenesulfonate, aminostyrene and derivatives or substituents thereof; homopolymers or copolymers of vinyl monomers such as methacrylates or methacrylic acid such as methyl methacrylate, ethyl methacrylate, butyl methacrylate, and hydroxyethyl methacrylate, acrylates or acrylic acid such as methyl acrylate, ethyl acrylate, butyl acrylate, and α-ethylhexyl acrylate, dienes such as butadiene and isoprene, acrylonitrile, vinyl ethers, maleic acids and maleic acid esters, homopolymers of vinyl monomers such as maleic anhydride, cinnamic acid, vinyl chloride, and vinyl acetate, or copolymers in combination with other monomers, or the like. Two or more of these resins can be used in combination.

A mean particle diameter of the aforementioned pigments is preferably in a range of 0.03 to 1 μm, and more preferably 0.05 to 0.5 μm.

When the mean particle diameter is less than 0.03 μm, the dispersion cost may increase or gelatinization of a dispersion solution may occur. When the mean particle diameter exceeds 1 μm, coarse particles in a pigment may impede the image forming layer and the image receiving layer being set into close contact with each other.

In the present invention, an image forming layer coating solution is applied onto a support and dried so as to form an image forming layer. However, the content of the pigment in the image forming layer coating solution with respect to the total solid weight of the image forming layer is preferably in a range of 25 to 70% by weight, and more preferably 30 to 60% by weight. Similarly, the content of an amorphous organic high polymer in the image forming layer coating solution with respect to the total solid weight of the image forming layer is preferably in a range of 70 to 30% by weight, and more preferably 60 to 40% by weight.

In the present invention, the content of pigment particles whose mean particle diameter is 1 μm or more in the pigment containing image forming layer coating solution with respect to the total solid weight of the image forming layer is preferably 3% by weight or less.

If the content of the pigment particles whose mean particle diameter is 1 μm or more exceeds 3% by weight, when the image forming layer is brought into contact with to the image receiving layer of a thermal transfer image receiving material which will be described later, difficulties in setting the layers in tight contact with each other in vicinities of such coarse pigment particles are likely to arise, thermal transferability of the thermal transfer material with respect to the image receiving layer deteriorates, and poor image transfer (transfer unevenness) due to microscopic air gaps formed at the contact surface between the image forming layer and the image receiving layer is thereby caused.

In a case in which a large number of layers having images (i.e., image forming layers having images formed thereon) are superposed repeatedly on the same thermal transfer image receiving material to form a multi-color image, it is preferable for the image forming layers to include a plasticizer therein in order to increase contact between images.

Examples of the plasticizer include: phthalates such as dibutyl phthalate, di-n-octyl phthalate, di(2-ethylhexyl) phthalate, dinonyl phthalate, dilauryl phthalate, butyllauryl phthalate, and butylbenzyl phthalate; esters of aliphatic dibasic acids, such as di(2-ethylhexyl)adipate and di(2-ethylhexyl)sebacate; triesters of phosphoric acid, such as tricresyl phosphate and tri(2-ethylhexyl)phosphate; polyol polyesters, such as polyethylene glycol esters; and epoxy compounds such as esters of epoxidized fatty acids.

In addition to the aforementioned ordinary plasticizers, suitable examples of plasticizsers include: acrylates, such as polyethylene glycol dimethacrylate, 1,2,4-butanetriol trimethacrylate, trimethylolethane triacetate, pentaerythritol triacrylate, pentaerythritol tetraacrylate, and dipentaerythritol polyacrylate, and used in the present invention depending on the type of the binder used. Two or more of these plasticizers may be used in combination.

Generally, the plasticizer is added to the image forming layer such that a content ratio (weight ratio) of the total amount of the pigment and the amorphous organic high polymer to the plasticizer is generally in a range of 100:0.5 to 1:1, and preferably 100:2 to 3:1.

In addition to the aforementioned components, a surfactant, a thickener, and the like may be added to the image forming layer as needed. The thickness (dry layer thickness) of the image forming layer preferably ranges from 0.2 to 1.5 μm, and more preferably ranges from 0.3 to 1.0 μm.

Each of the aforementioned components is dissolved in a solvent to prepare a solution, and this is applied onto a support by a known coating method and dried to thereby form an image forming layer.

The solvents to be used for the preparation of the image forming layer coating solution can be appropriately selected, in accordance with existence or non-existence of a light-to-heat conversion layer or the like, from the following solvents: alcohols such as ethyl alcohol, propyl alcohol, or the like, ketones such as aceton, methyl ethyl ketone, or the like, esters such as ethyl acetate, aromatic hydrocarbons such as toluene, xylene, or the like, ethers such as tetrahydrofuran, dioxane, or the like, amides such as DMF, N-methylpyrrolidone, or the like, cellosolves such as methylcellosolve, or the like. These solvents can be used solely, or two or more of them can be used in combination.

In order to prevent damage to the surface of the image forming layer, usually, a thermal transfer image receiving material, or a protective cover film such as a polyethylene terephthalate sheet or a polyethylene sheet can be laminated on the surface of the image forming layer.

Light-to-heat Conversion Layer

The light-to-heat conversion layer contains therein a light-to-heat conversion substance and a binder resin (which may be referred to as a "light-to-heat conversion layer binder polymer hereinafter), and can contain other components if necessary.

The light-to-heat conversion substance generally refers to a laser light absorptive material such as a dye capable of absorbing a laser light. Examples of such a dye (i.e., pigment or the like) include: a black pigment such as a carbon black, a pigment, which is a macrocyclic compound capable of absorbing rays in regions ranging from the visible region to the near infrared region, such as phthalocyanine, naphthalocyanine, or the like, an organic dye such as a cyanine dye (exemplified by an indolenine dye), an anthraquinone-based dye, an azulene-based dye, a phthalocyanine-based dye, or the like which is used as a laser absorptive material for a high density laser recording in an optical disk or the like, and a dye composed of an organometallic compound such as a dithiol/nickel complex or the like.

In order to increase image recording sensitivity, the light-to-heat conversion layer is preferably as thin as possible. For this reason, it is preferable to use an infrared absorptive dye such as a cyanine-based dye or a phthalocyanine-based dye which has a large light-absorptive coefficient in a laser light wavelength region.

An inorganic material such as a metallic material can also be used as a laser light-absorptive material in the light-to-heat conversion layer. The metallic material is used in the form of particles (e.g., blackened silver).

The optical density of the light-to-heat conversion substance in a region of the laser absorptive wavelength region is preferably in a range of 0.1 to 2.0, and more preferably 0.3 to 1.2.

When the optical density is less than 0.1, sensitivity of the thermal transfer material may deteriorate. When the optical density exceeds 2.0, the light-to-heat conversion layer having such an optical density is disadvantageous in view of the manufacturing cost.

Examples of the light-to-heat conversion layer binder polymer include: resins which have high glass transition points and high thermal conductivity, namely, typical heat resistant resins such as polymethylmethacrylate, polycarbonate, polystyrene, ethylcellulose, nitrocellulose, polyvinyl alcohol, gelatin, polyvinylpyrrolidone, polyparabanic acid, polyvinylchloride, polyamide, polyimide, polyetherimide, polysulfone, polyethersulfone, and aramide.

More specifically, in a case in which image recording is performed by arranging a plurality of rows of high power lasers such as multi-mode lasers, preferably, a polymer which has a high thermal resistance is used, more preferably, a polymer whose glass transition point Tg is in a range of 150 to 400° C. and whose temperature Td at which the weight of this polymer loses 5% by weight is 250° C. or more (measured by TGA method, where air temperature is increased by 10° C./min), and most preferably, a polymer whose Tg is in a range of 220 to 400° C., and whose Td is 400° C. or more.

The light-to-heat conversion layer can be formed by preparing a coating solution (i.e., a light-to-heat conversion layer coating solution) in which the light-to-heat conversion substance and the light-to-heat conversion layer binder polymer are dissolved. This coating solution is then applied to a support and then dried.

Examples of organic solvents for dissolving the light-to-heat conversion layer binder polymer include: 1,4-dioxane, 1,3-dioxolane, dimethyl acetate, N-methyl-2-pyrrolidone, dimethylsulfoxide, dimethylformamide, γ-butyrolactone or the like.

The application method used for application of the light-to-heat conversion layer coating solution can be selected from known application methods.

Drying is ordinarily conducted at 300° C. or less, and preferably at 200° C. or less. In using polyethylene terephthalate as a support, more preferably, the drying temperature is in a range of 80 to 150° C.

In the light-to-heat conversion layer which is formed as described above, the solid weight ratio of the light-to-heat conversion substance to the light-to-heat conversion layer binder polymer dye (the light-to-heat conversion substance:binder) is preferably in a range of 1:20 to 2:1, and more preferably 1:110 to 2:1.

If the amount of the binder is too small, cohesive strength of the light-to-heat conversion layer decreases, and when an image is transferred to the thermal transfer image receiving material, the light-to-heat conversion layer is liable to be transferred thereto as well, thus causing undesirable color mixing of the image. On the other hand, if the amount of the binder is too large, the light-to-heat conversion layer needs to be made thicker in order to achieve a necessary fixed light absorption ratio. This causes a deterioration of sensitivity.

The thickness of the light-to-heat conversion layer is preferably in a range of 0.03 to 0.8 μm, and more preferably 0.05 to 0.3 μm.

Preferably, the light-to-heat conversion layer has a maximum light absorbance (optical density) which is in a range of 0.1 to 1.3 (more preferably 0.2 to 1.1) in a wavelength range of 700 to 2000 nm.

The heat resistance (e.g., thermal deformation temperature or thermal decomposition temperature) of the binder polymer of the light-to-heat conversion layer is preferably higher than that of the material used for the layer to be provided on the light-to-heat conversion layer.

Heat-sensitive Peeling Layer

It is possible to provide a heat-sensitive peeling layer on the light-to-heat conversion layer of the thermal transfer material. The heat-sensitive peeling layer contains a heat-sensitive material which generates gas or releases adhesion water as a result of the action of heat generated from the light-to-heat conversion layer. The gas or adhesion water weakens the force with which the light-to-heat conversion layer and the image forming layer are held in contact with each other.

Examples of the heat-sensitive material include a compound (a polymer or a low molecular weight compound) which itself decomposes or degenerates dye to the action of heat and thereby generates a gas, and a compound (a polymer or a compound having a low molecular weight) which absorbs or takes up a large amount of easily volatile liquid such as water. Further, these compounds can be used in combination.

Examples of polymers which decompose or degenerate due to heat and thereby generate gas include: an auto-oxidizable polymer such as nitrocellulose, a halogen containing polymer such as chlorinated polyolefine, chlorinated rubber, polychlorinated rubber, polyvinyl chloride, or polyvinylidene chloride, an acrylic polymer such as polyisobutyl methacrylate in which a volatile compound such as water is adsorbed, a cellulose ester such as ethyl cellulose in which a volatile compound such as water is adsorbed, and a natural high polymer compound such as gelatin in which a volatile compound such as water is adsorbed can be listed. Examples of a low molecular weight compound which decomposes or degenerates due to heat and thereby generates a gas include: a compound such as a diazo compound or an azide compound which decomposes due to heat and thereby generates a gas. Further, such decomposition or degeneration of the heat-sensitive material due to heat as described above preferably occurs at 280° C. or less, and more preferably at 230° C. or less.

In a case in which a low molecular weight compound is used as the heat-sensitive material, it is desirable that the low molecular weight compound is used in combination with a binder. Such a binder may be, for example, a polymer which itself decomposes or degenerates due to heat and thereby generates a gas, and an ordinary polymer binder not having such characteristics as described above.

In a case in which a heat-sensitive low molecular weight compound and the binder are used in combination, the weight ratio of the former to the latter is preferably in a range of 0.02:1 to 3:1, and more preferably 0.05:1 to 2:1.

It is preferable that the heat-sensitive peeling layer covers the entire surface of the light-to-heat conversion layer. The thickness of the heat-sensitive peeling layer is generally in a range of 0.03 to 1 μm, and preferably 0.05 to 0.5 μm.

In a case where the thermal transfer material is structured such that the light-to-heat conversion layer, the heat-sensitive peeling layer, and the image forming layer are laminated to one another in that order and are provided on a support, the heat-sensitive peeling layer is decomposed or degenerated to thereby generate a gas due to heat transmitted from the light-to-heat conversion layer. Then, due to this decomposition or generation of a gas, a portion of the heat-sensitive peeling layer disappears or the heat-sensitive peeling layer becomes unable to stay in close contact with each other, and adhesion strength with which the light-to-heat conversion layer and the image forming layer are held in contact with each other deteriorates. Because of this behavior of the heat-sensitive peeling layer, a portion of the heat-sensitive peeling layer may come in tight contact with the image forming layer, and that portion may appear on the surface of the resulting image, thus causing color mixture of the image.

It is desirable that the heat-sensitive peeling layer is non-colored (i.e., it is desirable that the heat-sensitive peeling layer exhibits high permeability with respect to visible light) to prevent the appearance of color mixture on the image which has been formed even when such image transfer as described above of the heat-sensitive peeling layer is performed. More specifically, a light absorption coefficient of the heat-sensitive peeling layer is preferably 50% or less with respect to visible light, and more preferably 10% or less.

Instead of a heat-sensitive peeling layer being provided separately, the light-to-heat conversion layer can be used as a heat-sensitive peeling layer by adding a heat-sensitive material to the light-to-heat conversion layer.

As described above, when the thermal transfer material of the present invention is used to carry out the vacuum contact method, and even when the thermal transfer material has a large size (such as A2 size or larger), it is possible to carry out vacuum-suctioning at high speed during the laser thermal transfer recording, thus obtaining uniform contact without causing unpreferable air gaps or the like between the thermal transfer material and the thermal transfer image receiving material. Accordingly, even if a high power laser is used for the irradiation of the laminate, image defects caused by poor image transfer can be prevented. As a result, it is possible to form an image with high accuracy and high quality.

<Thermal transfer image receiving material>

The thermal transfer image receiving material can be structured in any form provided it retains an image from the thermal transfer material of the present invention by a thermal transfer process. For example, the thermal transfer image receiving material can be structured such that at least an image receiving layer is provided on an support. This support is provided separately from that of the aforementioned thermal transfer material. The thermal transfer image receiving material may also be structured to have other layers such as an undercoat layer, a cushion layer, a peeling layer, and an intermediate layer between the support or the image receiving layer if necessary. Further, providing a backing layer at a side opposite to the side at which the image forming layer is provided is also preferable in view of conveyance, storability, and surface roughening capability of the surface of the image receiving material when the thermal transfer image receiving material is taken-up in a roll. Further, providing an antistatic layer separately from these layers or adding an antistatic agent to each of the above-described layers is also preferable.

Image Receiving Layer

The image receiving layer is a layer which is formed with an organic polymer binder as a main component.

The organic polymer binder (which, in some cases, is referred to as an "image receiving layer binder polymer" hereinafter) is preferably a thermoplastic resin. Examples of the resin include: homopolymers or copolymers of acrylic monomers such as acrylic acid, methacrylic acid, acrylates, and methacrylates, cellulose-based polymers such as methyl cellulose, ethyl cellulose, and cellulose acetate, vinyl-based homopolymers and copolymers of vinyl-based monomers such as polystyrene, polyvinyl pyrrolidone, polyvinyl butyral, polyvinyl alcohol, and polyvinyl chloride, condensation polymers such as polyesters and polyamides, and rubber-based polymers such as butadiene/styrene copolymers.

In order for the image receiving layer and the image forming layer to be held in appropriately tight contact with each other, a glass transition temperature (Tg) of the image receiving layer binder polymer is preferably less than 90° C. It is possible to add a plascticizer to the image receiving layer. Further, Tg of the image receiving layer binder polymer is preferably 30° C. or more in order to prevent blocking between sheets.

In order for the image forming layer and the image receiving layer to be set in tight contact with each other during image recording by irradiation of a laser, and to improve sensitivity or image stability, a polymer, which is the same as or similar to the binder polymer for the image forming layer, is preferably used in the image receiving layer.

The thickness of the image receiving layer preferably ranges from 0.3 to 7 $\mu$m, and more preferably from 0.7 to 4 $\mu$m.

If the thickness of the image receiving layer is less than 0.3 $\mu$m, when an image is transferred (printed) onto printing paper, film strength is insufficient and becomes liable to be broken. If the thickness is more than 7 $\mu$m, after the image has been printed on printing paper, the gloss of the image increases, and reproducibility of the original image thereby deteriorates.

The plasticizer for the image receiving layer can be the same plasticizers which can be used for the image forming layer.

Support

A support used for the thermal transfer image receiving material may be, for example, exemplified by a base material in the form of a sheet such as a plastic sheet, a metal sheet, a glass sheet, paper, or the like.

Examples of the plastic sheet include: a polyethylene terephthalate sheet, a polyethylene naphthalate sheet, a polycarbonate sheet, a polyethylene sheet, a polyvinyl chloride sheet, a polyvinylidene chloride sheet, a polystyrene sheet, and a styrene/acrylonitrile copolymer sheet. A polyethylene naphthalate sheet is particularly preferable.

Examples of the paper include printing paper and coated paper.

Further, in view of cushioning characteristics, image visibility, or the like, a white material having bubbles inside is preferably used as a support. In particular, in view of mechanical properties, use of an expandable polyester support is most preferable.

In order to improve close contact between the image receiving layer and the support, the surface of the support can be treated by a corona discharging treatment or a glow discharging treatment.

The thickness of the support is generally in a range of 10 to 400 $\mu$m, and particularly preferably 25 to 200 $\mu$m.

Backing Layer

In order to improve surface roughening of the surface of the image receiving layer or conveying performance inside an image recording device, additives such as tin oxide fine particles, antistatic agents formed by fine particles such as silicon dioxide, or surfactants may be added to the backing layer.

These additives can be added not only to the backing layer but also to the image receiving layer and/or other layers if necessary.

Examples of the fine particles include: inorganic fine particles such as silicon dioxide, calcium carbonate, titanium dioxide, aluminum oxide, zinc oxide, barium sulfate, and zinc sulfate, organic fine particles formed by resins such as a polyethylene resin, a silicone resin, a fluorine containing resin, an acrylic resin, a methacrylic resin, and a melamine resin. Titanium dioxide, calcium carbonate, silicon dioxide, a silicone resin, an acrylic resin, and a methacrylic resin are particularly preferable. The mean particle diameter of the fine particles is preferably in a range of 0.5 to 10 $\mu$m and more preferably 0.8 to 5 $\mu$m.

The content of fine particles with respect to the total solid weight of the backing layer or the image receiving layer, is preferably in a range of 0.5 to 80% by weight, and more preferably 1 to 20% by weight.

The antistatic agent can be appropriately selected and used from various surfactants and electrically conductive agents such that the surface resistance of the backing layer is preferably $10^{12}$ Ω or less, and more preferably $10^{9}$ Ω or less under environmental conditions of 23° C. and 50% RH.

As described above, two aspects have been presented as examples of the thermal transfer image receiving material: aspect (1) in which the material has the image receiving layer on the support, and aspect (2) in which the material has the image receiving layer on one surface of the support and the backing layer containing fine particles on the other surface thereof. However, the present invention is not limited to these two aspect. The present invention can be the aspect below described. Namely, the present invention can be exemplified by an aspect (3) in which the thermal transfer image receiving material has a cushion layer provided between the support of (2) and the image receiving layer, or by an aspect (4) in which this material further contains in the image receiving layer of aspect (3), fine particles similar to those which have been used for the backing layer.

In a case of the above-described aspects (2) to (4), by taking up the thermal transfer image receiving material in a roll, the surface of the image receiving layer can be roughened due to pressure exerted by the backing layer containing fine particles.

In the same manner as in the aspects (3) and (4), by providing the cushion layer as the intermediate layer under the image receiving layer, failure of the image forming layer and the image receiving layer to come into tight contact with each other due to roughening of the surface of the image receiving layer can be prevented, and this cushion layer can be suitably applied to the present invention.

Cushion Layer

In order to solve the problem of the layer failing to come in close contact with each other due to surface roughening of the surface of the image receiving layer, as described above, it is preferable to provide the cushion layer between the support and the image receiving layer, of the thermal transfer image receiving material.

The cushion layer has a layer which deforms when stress is applied to the image receiving layer, and has the effects of improving contact between the image forming layer and the image receiving layer during the laser thermal transfer process, and of improving image quality as well. Further, during image recording, even if foreign matters enter between the thermal transfer material image receiving layer and the thermal transfer material, due to the deformation of the cushion layer, air gaps formed between the image receiving layer and the image forming layer become reduced in size. As a result, the cushion layer can minimize the size of defective image portions such as undyed portions and portions that are left white. Further, when the image which has been formed on the image receiving layer is then printed (transferred) on printing paper or the like which is prepared separately, the image receiving surface can be deformed according to surface roughness of the printing paper. Therefore, due to the effect of the cushion layer, the transfer performance of the image receiving layer can be improved. Further, due to the effect of the cushion layer, the gloss of image receiving materials can be decreased or controlled, and therefore reproducibility of the original image can be improved.

In order to apply cushioning characteristics to the cushion layer, a material having a low elastic modulus, a material having a rubber elastic modulus, or a thermal plastic resin which easily softens when heated can be used.

The elastic modulus is preferably in a range of 10 to 500 $kgf/cm^2$, and more preferably 30 to 150 $kgf/cm^2$ at the room temperature.

In order to immerse foreign matter such as rubber or the like, penetration (25° C., 100 g, 5 seconds) which is specified by JIS K2530 of the cushion layer is preferably 10 or more.

The glass transition temperature of the cushion layer is 80° C. or less, and preferably 25° C. or less. In order to control physical properties such as Tg, addition of a plasticizer to the polymer binder can be suitably performed.

Examples of binders for forming the cushion layer include: rubbers such as urethane rubber, butadiene rubber, nitrile rubber, acrylic rubber, natural rubber, and the like, as well as polyethylene, polypropylene, polyester, a styrene-butadiene copolymer, an ethylene-vinyl acetate copolymer, an ethylene-acrylic copolymer, a vinyl chloride-vinyl acetate copolymer, a vinylidene chloride resin, a plasticizer containing vinyl chloride resin, a polyamide resin, a phenol resin, and the like.

Generally, the thickness of the cushion layer depends on the type of resin or other conditions, but usually, the thickness of the cushion layer preferably ranges from 3 to 100 μm, and more preferably ranges from 10 to 50 μm.

It is necessary for the image receiving layer and the cushion layer to be set in close contact with each other by the laser recording stage. However, in order to print an image on the printing paper, the image receiving layer and the cushion layer are preferably provided so as to be peelable from each other. In order to facilitate this peeling-off, it is also preferable to provide a peeling layer having a thickness of about 0.1 to 2 μm between the cushion layer and the image receiving layer.

Preferably, this peeling layer functions as a barrier for the coating solvent when the image receiving layer is applied.

An example of a structure of the thermal transfer image receiving material is the lamination of the support/cushion layer/image receiving layer. However, in some cases, since the image receiving layer is used as the cushion layer, the thermal transfer image receiving material can be structured by the lamination of the support/cushioning characteristics containing image receiving layer, or the support/undercoat layer/cushioning characteristics containing image receiving layer. Even in this case, in order to make printing (transferring) of images onto printing paper possible, it is preferable to provide the cushioning characteristics containing image receiving layer so as to be peelable from this material. In this case, the printed image on the printing paper has excellent gloss.

The thickness of the cushion layer which is used as the image receiving layer preferably ranges from 5 to 100 μm, and more preferably ranges from 10 to 40 μm.

When the image which has been formed on the image receiving layer is then printed on the printing paper, preferably, at least one of the image receiving layers is formed by a light-curing material.

Examples of compositions of such light-curing material include: a combination of a) a photopolymerization monomer formed by at least one of a multifunctional vinyl compound and a multifunctional vinylidene compound capable of forming a photopolymer by addition polymerization, b) an organic polymer, and c) a photopolymerization initiator, and an additive such as a thermal photopolymerization inhibitor if necessary.

Examples of the monomer include: unsaturated esters of polyol, and esters of acrylic acid or methacrylic acid in particular (e.g. ethyleneglycol diacrylate, pentaerythritol tetraacrylate).

The organic polymer may be, for example, the same compositions as those used for the image receiving layer binder polymer.

Examples of the photopolymerization initiator include: ordinary radical photopolymerization initiators such as benzophenone and Michler's ketone. The photopolymerization initiator can be used in an amount of 0.1 to 20% by weight based on the total solid weight of the cushion layer.

Intermediate Layer

In preparing the cushion layer, in order to prevent fine particles which are contained in the surface-roughened backing layer or the image receiving layer from being immersed by the cushion layer, it is preferable to provide an intermediate layer.

Since the intermediate layer is used for such a purpose as described above, this layer does not deform easily in response to applied stress. Further, materials which can be applied to the cushion layer must be used for the intermediate layer, and this layer can be formed by including a polymer whose glass transition temperature is relatively high, such as PMMA, polystyrene, or cellulose triacetate.

<Thermal transfer recording method>

Next, a laser thermal transfer recording method of the present invention will be explained.

In the laser thermal transfer recording method of the present invention, a laminate is prepared by laminating the thermal transfer material and the thermal transfer image receiving material with each other so as to set the image receiving layer of the thermal transfer image receiving material and the surface of the image forming layer of the thermal transfer material in tight contact with each other. The surface of the thermal transfer material of the laminate is irradiated imagewise with a laser light in time series from the upper portion of the thermal transfer material of the laminate (i.e., from the thermal transfer material at the support side). Thereafter, the thermal transfer image receiving material and the thermal transfer material are peeled off from each other to thereby obtain the thermal transfer image receiving material onto which the image area irradiated with the laser light of the image forming layer is transferred.

The thermal transfer material and the thermal transfer image receiving material can be set in contact with each other directly before the irradiation operation of the laser light starts. In this irradiation operation, ordinarily, the thermal transfer image receiving material is set in tight contact with the surface of a recording drum (i.e., a rotation drum having therein a vacuum-forming mechanism and also having a large number of fine openings formed on the surface of the drum) due to vacuum-suctioning. Then, the thermal transfer material to be laminated with the thermal transfer image receiving material is set in close contact therewith such that the whole portion of the thermal transfer image receiving material is covered with the thermal transfer material while pressure reduction due to vacuum-suction is carried out at the contact surfaces therebetween. In this state, the irradiation operation is carried out such that the laminate is irradiated with the laser light from the outside thereof. That is, irradiation is carried out from the upper direction of the laminate thereof at the thermal transfer material side. The irradiation of the laser light is such that the recording drum, which has the laminate thereon, is scanned by the surface thereof by being irradiated with the laser light which moves back and forth in a widthwise direction of the drum. During the irradiation operation, the recording drum is made to rotate at a fixed angular speed.

The laser thermal transfer recording method of the present invention can be applied not only for formation of a black mask or a monochromatic image but can also be favorably used for formation of a multicolor image.

A multicolor image is formed by, for example, a method including the steps of separately providing three types (three color) or four types (four colors) of laminates in which each heat transfer material of the laminations has image forming layer including color agent of respectively different hues; irradiating each of the laminates with laser light, which is corresponding to the laminate, on the basis of a digital signal for each of the color images obtained by a color separation filter; peeling the thermal transfer material and the thermal transfer image receiving material off from each other; and after a color separation image for each color is formed on each of the thermal transfer image receiving materials, transferring the color separation image onto an actual support, such as printing paper or the like, prepared separately for obtaining a multicolor image.

Examples of laser light sources for the image recording process include: direct laser lights, such as a gas laser such as an argon ion laser, a helium/neon laser, and a helium/cadmium laser, a solid-state laser such as a YAG laser, a semiconductor laser light, a dye laser, and excimer laser, or a laser light which is passed through a secondary harmonic element and is thereby converted to a halved wavelength. Among these examples, from a viewpoint of high power and high speed image forming capability, use of a multi-mode semiconductor laser is preferable, and use of a refractive index guided multi-mode laser diode and a lateral multi-mode laser diode are particularly preferable.

Laser heads using the aforementioned lasers may be, for example, a recording head in which the aforementioned semiconductor laser and optical system disclosed in Japanese Patent Application Laid-Open (JP-A) No. 10-60196 are used in combination, and a laser head disclosed in U.S. Pat. No. 4,743,091, and JP-A No. 10-339836 which is multi-beamed and which uses the aforementioned optical system. These heads are preferable in view of high productivity.

In the laser thermal transfer recording method using these thermal transfer materials of the present invention, it is preferable to irradiate a laser light such that the beam diameter on the light-to-heat conversion layer is in a range of 3 to 50 $\mu$m, and preferably 7 to 30 $\mu$m.

As the result of the laser thermal transfer recording method of the present invention, an image recording using a high power laser such as a multi-mode semiconductor laser becomes possible so that images with high accuracy and high quality can be formed at high speed.

EXAMPLES

With reference to examples, the present invention will be explained hereinafter. However, the present invention is not limited to these examples. Further, "part" and "%" in examples represent "part by weight" and "% by weight", respectively.

Example 1

<Preparation of a light-to-heat conversion material>

Preparation of a Light-to-heat Conversion Layer Coating Solution

The following compositions are mixed while being stirred by using a stirrer to thereby obtain a light-to-heat conversion coating solution (1).

[Composition of the light-to-heat conversion coating solution (1)]

| | |
|---|---|
| Infrared light-absorbing dye (NK-2014 manufactured by Nippon Kanko Shikiso Co., Ltd.) | 10 parts by weight |
| Binder (RIKACOAT SN-20 manufactured by New Japan Chemical Co., Ltd.) | 200 parts by weight |

-continued

| | |
|---|---|
| N-methyl-2-pyrrolidone | 2000 parts by weight |
| Surfactant (MEGAFAC F-177 manufactured by Dainippon Ink and Chemicals Inc.) | 1 part by weight |

The light-to-heat conversion layer coating solution (1) obtained as described above was applied to one surface of a polyethylene terephthalate film (center line average surface roughness: Ra=0.04 μm) whose thickness is 100 μm, by using a rotary applicator (spin coater). Thereafter, the resultant film was dried in an oven for two minutes at the temperature of 120° C. to thereby form the light-to-heat conversion layer on the support.

In the wavelength range of 700 to 1000 nm, the absorption peak of the light-to-heat conversion layer thus formed is at 810 nm. When absorbance (optical density: OD) of the light-to-heat conversion layer by using a semiconductor laser light (i.e., a multi-mode semiconductor laser whose output rating is 1W), which is used during an image recording process and which has a wavelength of 830 nm, is measured, OD was equal to 1.0.

When the cross section of the light-to-heat conversion layer was observed by using a scanning electron microscope, the thickness of the light-to-heat conversion layer was 0.3 μm (a mean value).

Preparation of a Yellow-color Image Forming Layer Coating Solution

A kneader mill was filled with polyvinylbutyral, a pigment (C. I. PY-14), and a dispersion aid in a predetermined amount, respectively. A shearing force was applied to the resultant mixture while a small amount of n-propyl alcohol as a solvent was added thereto to perform a dispersion pretreatment. To the resultant dispersion, a solvent similar to the above solvent was further added, and this was prepared so as to result with the composition below. To this, glass beads were added and sand mill dispersion was performed for two hours. The glass beads were then removed to thereby prepare a yellow pigment dispersion mother liquor (1).

[Composition of the yellow pigment dispersion mother liquor (1)]

| | |
|---|---|
| Polyvinyl butyral (DENKA BUTYRAL No. 2000-L, having a Vicat softening point of 57° C., and manufactured by Denki Kagaku Kogyou Co., Ltd.) | 9.78 parts by weight |
| Coloring material (Yellow pigment (C.I. PY-14)) | 17.8 parts by weight |
| Dispersion aid (SOLSPERSE S-20000 manufactured by ICI Japan Ltd.) | 0.8 parts by weight |
| n-propyl alcohol | 140 parts by weight |

The following compositions were mixed while being stirred with using a stirrer to prepare a yellow-color image forming layer coating solution (1).

| | |
|---|---|
| [Composition of the yellow-color image forming layer coating solution (1)] the yellow pigment dispersion mother liquor (1) | 180 parts by weight |
| Polyvinyl butyral (DENKA BUTYRAL No. 2000-L manufactured by Denki Kagaku Kogyou Co., Ltd.) | 5.12 parts by weight |
| Stearic acid amide | 3.2 parts by weight |
| Nonionic surfactant (CHEMISTAT 1100 manufactured by Sanyo Chemicals industries, Ltd.) | 0.52 parts by weight |
| Rogin (KE-311 manufactured by Arakawa Chemicals Co., Ltd.) | 3.38 parts by weight |
| Surfactant (MEGAFAC F-176P manufactured by Dainippon Ink and Chemicals Inc.) | 1.1 parts by weight |
| n-propyl alcohol | 1130 parts by weight |
| Methyl ethyl ketone | 285 parts by weight |

The mean particle diameter of the particles in the yellow-color image forming layer coating solution (1) obtained as describes above was measured by using a laser light scattering method particle size distribution measuring apparatus and found to be 0.37 μm, and the proportion of pigment particles whose mean particle diameter was 1 μm or more in this solution was 0.8%.

The yellow-color image forming layer coating solution (1) was applied to the light-to-heat conversion layer formed as described above for a minute by using a spin coater, and this was dried for two minutes in an oven at 100° C. to thereby form a yellow-color image forming layer on the light-to-heat conversion layer.

When absorbance (optical density: OD) of the yellow-color image forming layer was measured by using a Macbeth densitometer TD-904 (Blue filter), OD was equal to 0.71. Further, when the cross section of the yellow-color image forming layer was observed by using a scanning electron microscope, thickness thereof was 0.4 μm (a mean value).

In this way, a thermal transfer material (1) having a support, upon which the light-to-heat conversion layer and the yellow-color image forming layer are provided in that order was obtained.

<Measurement of center line average surface roughness Ra>

The thermal transfer material (1) obtained as described above was measured the center line average surface roughness Ra of the surface of the image forming layer thereof. The measurement was carried out by using a surface roughness meter (SURFCOM 575A-3D manufactured by Tokyo Seimitsu Co., Ltd.) under the conditions described below. The results of the measurement are shown in Table 1 below.

(Measurement conditions)

| | | |
|---|---|---|
| Axial magnification | 20000 | |
| Cut-off value | 0.08 | mm |
| Reference length | 5.0 | mm |
| Conveying speed | 0.03mm/sec. | |

<Measurement of smoothster value>

The thermal transfer material (1) obtained as described above was measured a smoothster value of the thermal transfer material (1) by the smoothness meter (DIGITAL SMOOTHSTER manufactured by Toei Electronics Co., Ltd.) to obtain a value. This value was used as an index expressing the smoothness of the thermal transfer material. The measurement results are shown in Table 1 below.

<Preparation of a thermal transfer image receiving material>

A cushioning intermediate layer coating solution (1) and an image receiving layer coating solution (1) each having the following composition were prepared.

[Composition of a cushioning intermediate layer coating solution (1)]

| | |
|---|---|
| Copolymer of vinyl chloride and vinyl acetate (MPR-TSL manufactured by Nissin Chemical Industry Co., Ltd.) | 20 parts by weight |
| Plasticizer (adipic acid based polyester) (PARAPLEX G40 manufactured by CP, HALL, company) | 10 parts by weight |
| Surfactant (MEGAFAC F-177 manufactured by Dainippon Ink and chemicals Inc.) | 0.5 parts by weight |
| Antistatic agent (SAT-5 SUPER (IC) manufactured by Nihon Pure-Chemical Co., Ltd.) | 0.3 parts by weight |
| Methyl ethyl ketone (solvent) | 60 parts by weight |
| Toluene | 10 parts by weight |
| N,N-dimethyl formamide | 3.0 parts by weight |

[Composition of an image receiving layer coating solution (1)]

| | |
|---|---|
| Polyvinyl butyral (S-REC B BL-SH manufactured by Sekisui Chemical Co., Ltd.) | 8.0 parts by weight |
| Antistatic agent (SUNSTAT 2012A manufactured by Sanyo Chemicals Industries, Ltd.) | 0.7 parts by weight |
| Surfactant (MEGAFAC F-177 manufactured by Dainippon Ink and Chemicals Inc.) | 0.1 parts by weight |
| n-propyl alcohol | 20 parts by weight |
| Methanol | 20 parts by weight |
| 1-methoxy-2-propanol | 50 parts by weight |

A white PET support (LE MIRROR E-68L manufactured by Toray Industries Inc), whose thickness is 135 μm, whose core is expandable polyester, and which contains calcium carbonate fine particles on both sides of the core, was prepared. To this support was applied the cushioning intermediate layer coating solution (1) obtained as described above by using a small width application device, and this was then dried so as to have a layer thickness of about 20 μm after drying. Then, the image receiving coating layer solution (1) obtained as described above was further applied to the cushioning intermediate layer, and then dried so as to have a layer thickness of about 2 μm after drying. Thereafter, the resultant material was wound onto a cylindrical paper roll core whose inner diameter is 3 inches and whose thickness is 2 mm while applying a tension of 15 kg/m.

Thereafter, the wound-up roll was allowed to stand over a week at room temperature to thereby obtain a thermal transfer image receiving material (1).

After having been allowed to stand, the thermal transfer image receiving material (1) thus obtained was measured the center line average surface roughness Ra of the surface of the image receiving layer thereof by using the surface roughness measuring apparatus, and the Ra was 0.13, and the smoothster value thereof measured by the smoothness meter was 0.7 or less.

Waviness of each of the surfaces of the thermal transfer material (1) and the thermal transfer image receiving material (1) obtained as described above (maximum height measured by a surface roughness meter under measurement conditions where axial magnification: 20000, cut-off value: 8 mm, reference length: 5 mm, and conveying speed: 0.15 mm/sec.) was equal to or less than 2 μm.

<Evaluation of recording sensitivity>

The thermal transfer image receiving material (1) (25 cm×35 cm) obtained as described above was wound around a rotation drum whose diameter is 25 cm and which has vacuum suction holes with a diameter of 1 mm formed thereon (at a surface density of one hole per area of 3 cm×3 cm). The thermal transfer image receiving layer was then suctioned. Then, the thermal transfer material (1) (30 cm×40 cm) was laminated to the thermal transfer image receiving material (1) such that the thermal transfer material (1) protrudes out evenly at each side of the thermal transfer image receiving material (1). A laminate is formed by adhering the thermal transfer material (1) and the thermal transfer image receiving material (1) to each other such that air is suctioned into the suction holes of the rotating drum while these materials are squeezed by a squeeze roller. The degree of pressure reduction when the suction holes were blocked was −150 mmHG/atm.

Due to the rotation of the above described drum, the surface of the laminate on the drum was irradiated from the side of the support of the thermal transfer material (1) with a semiconductor laser light (i.e., a multi-mode semiconductor laser whose output rating is 1W) having a wavelength of 830 nm so as to converge the laser light onto the surface of the light-to-heat conversion layer. Then, laser irradiation was performed by moving the laser light in a direction orthogonal (the sub-scanning direction) to a rotating direction of the drum (main-scanning direction) so that image was recorded imagewise. Conditions for the laser irradiation are described below:

(Laser irradiation conditions)

Laser power: 300 mW

Beam diameter: 15 μm in a main-scanning direction (Gaussian distribution),

24 μm in a sub-scanning direction (rectangular beam)

Main-scanning direction: 7 m/sec.

Sub-scanning pitch: 30 μm

Environmental temperature/humidity: 25° C., 50% RH

When the laminate, having been subjected to the laser image recording, was removed from the drum, and the thermal transfer material (1) and the thermal transfer image receiving material (1) of the present invention were peeled off from each other, it was confirmed that portions of the image irradiated with the laser were transferred to the thermal transfer image receiving material (1).

Further, when the transferred image was observed using an optical microscope, the laser irradiated portions were recorded on the thermal transfer image receiving material (1) so as to form lines. The recorded lines were measured and sensitivity was determined by using the following equation. The results are shown below in Table 1.

$$\text{Sensitivity} = (\text{laser power } P)/(\text{linear width } d \times \text{linear velocity } v)$$

<Evaluation of image quality>

Dot images (5%, 50%, and 95%) were formed by the laser recording and these images were observed by using by an optical microscope (magnification: 100 times), and evaluation of sensitivity with respect to microscopic transfer unevenness was carried out in accordance with the following criteria. The results of evaluation are shown in Table 1 below.

(Criteria for evaluation)

◎: Unevenness (blanks or gaps) resulting from image transfer was not found and contours of the dots were excellent.

○: A small amount of transfer blanks was found. However, This caused no problem in practice.

Δ: Transfer blanks were found.

X: Transfer blanks were noticeable, and contours of the dots were non-uniform.

<Evaluation of transfer rate>

The thermal transfer image receiving material having a solid image (which corresponds to a 100% dot area) recorded thereon was passed through a laminator (whose heat roller temperature is 130° C., which is pressurized by compressed air of 4 kg/cm$^2$, and whose conveying speed is 0.3 m/min.) by overlapping the thermal transfer image receiving material and art paper with each other such that the solid image is made to be in contact with the art paper.

After being cooled to room temperature, the laminated thermal transfer image recording material and the art paper were peeled off from each other, and the image receiving layer having the solid image thereon was transferred onto the art paper. Optical reflection density at that time was measured by a Macbeth reflection densitometer (green filter), and a reflection density r was measured.

In the same manner as described above, the thermal transfer image receiving material without an image recorded thereon was passed through a laminator by overlapping the thermal transfer image receiving material and the art paper with each other such that the image receiving layer was made contact with the art paper. In the same manner as described above, optical reflection density R was measured. By using the resultant r and R, a transfer rate during the laser thermal transfer of an image [(r/R)×100] was determined. The results are shown in Table 1 below:

Comparative Example 1

A yellow-color image forming layer coating solution (2) was prepared in the same manner as Example 1, and a thermal transfer material (5) was also prepared in the same manner as Example 1 except that, the kneader mill which was used for the preparation of the yellow-color image forming layer coating solution in Example 1 was replaced by Paint shaker (manufactured by Toyo Seiki Seisakusho, Ltd.) so that a pigment dispersion was performed for an hour. In the same manner as Example 1, the Ra value and the smoothster value were measured by using the thermal transfer material (5). When the pigment particle diameter in the yellow-color image forming layer coating solution which was prepared as described above was measured, the content of the pigment particles whose particle diameter is more than 1 μm in this coating solution was 5%.

In the same manner as Example 1, by using the thermal transfer image receiving material (1) obtained in Example 1, image recording processing was performed. Thereafter, in the same manner as Example 1, evaluation of sensitivity and image quality, and calculation of transfer rate were performed. The results from measurement and evaluation are shown in Table 1 below:

Waviness of the surface of the thermal transfer material (5) (whose peak height was measured by a surface roughness meter under conditions of axial magnification: 20000, cut-off value: 8 mm, reference length: 5 mm, and conveying speed: 0.15 mm/sec.) was equal to or less than 2 μm.

Example 2

In preparing a thermal transfer material, a coating solution for a cushioning intermediate layer (2) having the following composition was prepared. The cushioning intermediate layer coating solution (2) was applied to a support which is the same as the transparent polyethylene terephthalate support (Ra=0.03 μm) of example 1, and dried so that a cushioning intermediate layer was formed. Thereafter, also in the same manner as Example 1, a light-to-heat conversion layer and an image forming layer are formed on the intermediate layer in this order, and a thermal transfer material (2) was thereby prepared. The thickness of the cushioning intermediate layer was 6 μm.

[Composition of a cushioning intermediate layer coating solution (2)]

| | |
|---|---|
| Ethylene-vinyl acetate resin (EV-40Y manufactured by Mitsui-Dupont Polychemical Co., Ltd.) | 10 parts by weight |
| Toluene | 50 parts by weight |
| Methyl ethyl ketone | 20 parts by weight |

In the same manner as Example 1, the Ra value and the smoothster value were measured by using the thermal transfer material (2).

In the same manner as Example 1, image recording was performed by using the thermal transfer image receiving material (1) which was obtained in Example 1. Thereafter, in the same manner as Example 1, evaluation of sensitivity and image quality, and calculation of transfer rate were performed. The results from measurement and evaluation are shown in Table 1 as below:

Waviness of the surface of the thermal transfer material (2) (whose peak height was measured by a surface roughness meter under conditions of axial magnification: 20000, cut-off value: 8 mm, reference length: 5 mm, and conveying speed: 0.15 mm/sec.) was equal to or less than 2 μm.

Example 3

<Preparation of a thermal transfer material>

Preparation of a Light-to-heat Conversion Layer Coating Solution

The following compositions were mixed while being stirred with a stirrer to prepare the light-to-heat conversion layer coating solution (2).

[Compositions of a light-to-heat conversion layer coating solution (2)] the carbon black dispersion mother liquor described below

| | |
|---|---|
| | 20 parts by weight |
| N-methyl-2-pyrrolidone | 60 parts by weight |
| Surfactant (MEGAFAC F-177 manufactured by Dainippon Ink and Chemicals Inc.) | 0.05 part by weight |

Here, the carbon black dispersion mother liquor was prepared as described blow.

A kneader mill was filled with a fixed amount of the binder, carbon black, and the dispersion aid as described below. A shearing force was applied to the resultant mixture while a small amount of N-methyl-2-pyrrolidone as a solvent was added thereto, and a dispersion pretreatment was performed. To the resultant dispersion was added a solvent similar to the aforementioned solvent such that the mother liquor ends up with the following composition. Then, to the resultant dispersion solution was added glass beads, and sand mill dispersion was performed for two hours. Thereafter, the glass beads were removed from the dispersion solution, and a carbon black dispersion mother liquor was prepared.

[Composition of a carbon black dispersion mother liquor]

| | |
|---|---|
| Binder (RIKACOAT SN-20 manufactured by New Japan Chemical Co., Ltd.) | 60 parts by weight |
| Carbonblack (MA-100 manufactured by Mitsubishi Chemical Corp.) | 10 parts by weight |
| Dispersion aid (SOLSPBRSE S-20000 manufactured by ICI Japan Ltd.) | 0.8 parts by weight |
| N-methyl-2-pyrrolidone | 60 parts by weight |
| Glass beads | 100 parts by weight |

A thermal transfer material (3) of the present invention was obtained in the same manner as Example 1 except that, instead of the light-to-heat conversion layer coating solution (1) used in Example 1, the light-to-heat conversion layer solution (2) obtained as described above was used. Thickness of the light-to-heat conversion layer which is formed on the support was measured in the same manner as in Example 1. The result was 0.3 $\mu$m.

In the same manner as Example 1, the thermal transfer material (3) was used to measure Ra value and smoothster value of the surface of the image forming layer.

Further, the thermal transfer image receiving material (1) which was obtained in Example 1 was used to carry out perform an image recording in the same manner as Example 1. Thereafter, in the same manner as Example 1, calculation of the transfer rate, and evaluation of sensitivity and image quality were carried out. The results of measurement and evaluation are shown in Table 1 below.

Waviness of the surface of the thermal transfer material (3) was 2 $\mu$m or less (i.e., peak height of waviness was measured by a surface roughness meter under the conditions of longitudinal magnification: 20000, cut-off value: 8 mm, reference length: 5 mm, and conveying speed: 0.15 mm/sec.).

Example 4

A thermal transfer material (4) of the present invention was obtained in the same manner as Example 2 except that, instead of the yellow-color image forming layer coating solution (1) which was used in Example 2, the yellow-color image forming layer coating solution (2) which was used in Comparative Example 1 was used.

The thermal transfer image receiving material (1) which was obtained in Example 1 was measured in the same manner as Example 1. Thereafter, in the same manner as Example 1, calculation of transfer rate, and evaluation of sensitivity and image quality were carried out. The results of measurement and evaluation are shown in Table 1 below.

Waviness of the surface of the thermal transfer material (4) was 2 $\mu$m or less (Peak height of the waviness was measured using a surface roughness meter under conditions of longitudinal magnification: 20000, cut-off value: 8 mm, reference length: 5 mm, and conveying speed: 0.15 mm/sec.).

Comparative Example 2

A thermal transfer material (6) was obtained in the same manner as Example 1 except that instead of the yellow pigment dispersion mother liquor (1) which was prepared in Example 1, a magenta pigment dispersion mother liquor having the following composition was used.

[Composition of a magenta pigment dispersion mother liquor]

| | |
|---|---|
| Polyvinyl butyral (DENKA BUTYRAL No. 2000-L manufactured by Denki Kagaku Kogyou Co., Ltd.) | 12.6 parts by weight |
| Coloring material (magenta pigment (C.I. PR 57:1) | 15 parts by weight |
| Silicone resin fine particle (mean particle diameter: 2.0 $\mu$m) (TOS-PEARL 120 manufactured by Toshiba Silicone Co., Ltd.) | 1.0 parts by weight |
| Dispersion aid (SOLSPERSE S-20000 manufactured by ICI Japan Ltd.) | 0.8 parts by weight |
| n-propyl alcohol | 140 parts by weight |

The thermal transfer material (6) was measured Ra value and smoothster value of the surface of the image forming material in the same manner as Example 1.

The thermal transfer image receiving material (1) which was obtained in Example 1 was used so as to carry out an image recording in the same manner as Example 1. Thereafter, in the same manner as Example 1, calculation of transfer rate and evaluation of sensitivity and image quality were carried out. The results of the measurements and evaluation are shown in Table 1 below.

Waviness of the surface of the thermal transfer material (6) was 2 $\mu$m or less (peak height of the waviness was measured by a surface roughness meter under conditions of longitudinal magnification: 20000, cut-off value: 8 mm, reference length: 5 mm, and conveying speed: 0.15 mm/sec.).

Comparative Example 3

A thermal transfer material (7) was obtained in the same manner as Example 1 except that, instead of silicone resin fine particles which were used in Example 2, 1.5 parts by weight of PMMA particles whose mean diameter is 5 $\mu$m were added.

The thermal transfer material (7) was measured the Ra value and the smoothster value of the surface of the image forming layer in the same manner as Example 1.

The thermal transfer image receiving material (1) which was obtained in Example 1 was used so as to carry out image recording in the same manner as Example 1. Thereafter, in the same manner as Example 1, calculation of transfer rate and evaluation of sensitivity and image quality were carried out. The results of the measurements and evaluations are shown in Table 1 below.

Waviness of the surface of the thermal transfer material (7) was 2 $\mu$m or less (peak height of the waviness was measured by a surface roughness meter under conditions of longitudinal magnification: 20000, cut-off value: 8 mm, reference length: 5 mm, and conveying speed: 0.15 mm/sec.).

TABLE 1

| | Content of pigment particles with a particle diameter of 1 μm or more | Smoothster value (mmHg) | Ra (μm) | Sensitivity (mJ/cm$^2$) | Image quality | Transfer rate (%) |
|---|---|---|---|---|---|---|
| Example 1 | 0.8 | 0.7 or less | 0.05 | 250 | ⊚ | 95 |
| Example 2 | 0.8 | 0.7 or less | 0.09 | 230 | ⊚ | 98 |
| Example 3 | 0.8 | 0.7 or less | 0.08 | 270 | ○ | 93 |
| Example 4 | 5 | 0.7 or less | 0.09 | 250 | ⊚ | 97 |
| Com. Example 1 | 5 | 3 | 0.08 | 260 | Δ~X | 89 |
| Com. Example 2 | — | 3 | 0.1 | 240 | X | 87 |
| Com. Example 3 | 0.8 | 30 | 0.22 | 240 | XX | 83 |

From the results of Table 1, in the thermal transfer materials (1) to (4) of the present invention in which the smoothster value and the center line average surface roughness Ra of the surface of the image forming layer fall within a range specified by the present invention, since the thermal transfer material and the thermal transfer image receiving material can be brought into tight contact with each other, it was possible to transfer an image at a high transfer rate, and it was thereby possible to obtain uniform, highly accurate, and high quality images without unevenness.

In a case of the thermal transfer material (4) containing therein 3% by weight or more of pigment particles whose particle diameter is 1 μm or more, due to the action of the cushion layer, the smoothster value can within the range specified by the present invention and a high quality image be thereby obtained.

In the thermal transfer materials (5) to (7) in which the smoothster value and the center line average surface roughness Ra of the surface of the image forming layer do not fall within the range specified by the present invention, image transfer rate was low. Accordingly, as the image transfer rate decreases, unevenness due to the image transfer (microscopic blanks or gaps) became noticeable.

In a case of the thermal transfer material (5) which contains therein 3% by weight or more of pigment particles whose particle diameter is 1 μm or more, the smoothster value cannot be made to fall within the range specified by the present invention and so it was impossible to form a high quality image.

In accordance with the thermal transfer material of the present invention, even if the size of the thermal transfer material is large, since a high speed vacuum suction can be performed during a laser thermal transfer recording of an image, uniform adhesiveness and image transfer efficiency can be obtained without causing undesirable air gaps or the like to form between the thermal transfer image receiving material and the thermal transfer material which are kept in close contact with each other.

In accordance with the laser thermal transfer recording method of the present invention, since image recording by using a high power laser such as a multi-mode semiconductor laser is enabled, images with high accuracy and high quality can be provided speedily.

What is claimed is:

1. A thermal transfer material comprising a support, and a light-to-heat conversion layer and an image forming layer provided on the support, the image forming layer having a surface with a smoothster value of no more than 2 mmHg, and a center line average surface roughness Ra of the surface of the image forming layer is in a range of 0.03 to 0.2 μm, wherein the image forming layer includes a pigment and an amorphous organic high polymer.

2. A thermal transfer material according to claim 1, wherein the image forming layer is formed by applying and drying a coating solution in which the content of pigment particles having a particle diameter of no less than 1 μm is no more than 3% by weight with respect to the total solids of the image forming layer.

3. A thermal transfer material according to claim 1, wherein the center line average surface roughness is in a range of 0.04 to 0.15 μm.

4. A thermal transfer material according to claim 1, wherein the center line average surface roughness is in a range of 0.05 to 0.1 μm.

5. A thermal transfer material according to claim 1, wherein the smoothster value is no more than 1 mmHg.

6. A thermal transfer material according to claim 1, wherein a mean particle diameter of a pigment contained in said image forming layer is in a range of 0.03 to 1 μm.

7. A thermal transfer material according to claim 1, wherein the image forming layer further contains a plasticizer, and a weight ratio of the content of the total amount of the pigment and the amorphous organic high polymer to the amount of the plasticizer is in a range of 100:0.5 to 1:1.

8. A thermal transfer material according to claim 1, wherein thickness of the image forming layer as substantially dried is in a range of 0.2 to 1.5 μm.

9. A thermal transfer material according to claim 1, wherein the light-to-heat conversion layer includes a light-to-heat conversion substance and a binder resin.

10. A thermal transfer material according to claim 1, wherein the light-to-heat conversion layer has an absorption peak in a wavelength range of 700 to 2000 nm, and an absorbance thereof is in a range of 0.1 to 1.3.

11. A laser thermal transfer recording method, comprising the steps of:

(a) forming a thermal transfer material by providing on a support a light-to-heat conversion layer and an image forming layer, with the image forming layer including a pigment and an amorphous organic high polymer and having a smoothster value of no more than 2 mmHg, and a center line average surface roughness Ra in a range from 0.03 to 0.2 μm;

(b) adhering a thermal transfer image receiving material and the thermal transfer material to each other by an evacuation method;

(c) directing laser light onto said thermal transfer material to form an image; and (d) separating the thermal transfer image receiving material and the thermal transfer material from each other.

12. A laser thermal transfer recording method according to claim 11, wherein the step of directing laser light includes using a multi-mode semiconductor laser.

13. A laser thermal transfer recording method according to claim 11, wherein the step of directing laser light includes using at least one of a refractive index guided multi-mode semiconductor diode and a lateral multi-mode semiconductor diode.

14. A thermal transfer material according to claim 11, wherein the step of forming a thermal transfer material includes applying and drying a coating solution for the image forming layer in which the content of pigment particles having a particle diameter of no less than 1 μm is no more than 3% by weight with respect to the total solids of the image forming layer.

15. A laser thermal transfer recording method according to claim 11, wherein the step of adhering a thermal transfer image receiving material includes using a thermal transfer image receiving material comprising an organic polymer binder as a main component, and the organic polymer binder is a thermoplastic resin.

16. A laser thermal transfer recording method according to claim 11, wherein the thermal transfer image receiving material comprises a support, an image receiving layer, and at least one layer selected from the group consisting of undercoat layer, a cushion layer, a peeling-off layer, an intermediate layer between the support and the image receiving layer, and a backing layer on a side of the support opposite to where the image receiving layer is provided.

17. A method of forming a laser thermal transfer recording material according to claim 11, wherein the step of forming a thermal transfer material including providing at least one of a heat-sensitive peeling layer and a cushion layer.

18. A laser thermal transfer recording method according to claim 11, further comprising the step of printing the image on paper.

19. A method of forming a laser thermal transfer recording material comprising the steps of:

(a) forming a thermal transfer material by providing on a support a light-to-heat conversion layer and an image forming layer, with the image forming layer including a pigment and an amorphous organic high polymer and having a smoothster value of no more than 2 mmHg, and a center line average surface roughness Ra in a range from 0.03 to 0.2 μm; and (b) adhering a thermal transfer image receiving material and the thermal transfer material to each other by an evacuation method.

* * * * *